United States Patent [19]
Nakatomi et al.

[11] Patent Number: 5,931,452
[45] Date of Patent: Aug. 3, 1999

[54] WIRE CLAMPER FOR BONDING APPARATUS

[75] Inventors: Yoshiharu Nakatomi, Zamai; Yasuhiro Matsui, Tokyo, both of Japan

[73] Assignees: Tosok Corporation, Kanagawa; Moritex Corporation, Tokyo, both of Japan; Etrema Products, Inc., Ames, Iowa

[21] Appl. No.: 09/021,549

[22] Filed: Feb. 10, 1998

[51] Int. Cl.⁶ ........................................ B25B 1/06
[52] U.S. Cl. ..................... 269/216; 269/224; 269/254 R
[58] Field of Search .................... 269/216, 3, 8, 269/13, 219–329, 32, 221, 254 CS, 238, 254 R, 237, 239, 224, 234

[56] References Cited

U.S. PATENT DOCUMENTS

| | | | |
|---|---|---|---|
| 2,241,021 | 5/1941 | Riebe | 269/3 |
| 3,170,322 | 2/1965 | Cavanaugh | 269/234 |
| 3,672,556 | 6/1972 | Diepeveen | 269/47 |
| 4,142,714 | 3/1979 | Diepeveen | 269/8 |
| 5,201,501 | 4/1993 | Fassier | 269/32 |
| 5,314,175 | 5/1994 | Izumi et al. | 269/224 |
| 5,732,938 | 3/1998 | Rajanathan et al. | 269/8 |
| 5,746,422 | 5/1998 | Harada et al. | 269/329 |

*Primary Examiner*—David A. Scherbel
*Assistant Examiner*—Lee Wilson
*Attorney, Agent, or Firm*—Bachman & LaPointe, P.C.

[57] ABSTRACT

A wire clamper for a bonding apparatus includes a pair of clamper arms having tip portions, respectively. The tip portions clamp or release a wire therebetween when at least one of the clamper arms is operated. The wire clamper further includes a giant-magnetostrictive actuator having a giant-magnetostrictive alloy and a coil wound around the giant-magnetostrictive alloy for generating a magnetic field. The giant-magnetostrictive alloy is displaced according to the magnetic field generated by the coil so as to operate at least one of the clamper arms.

7 Claims, 7 Drawing Sheets

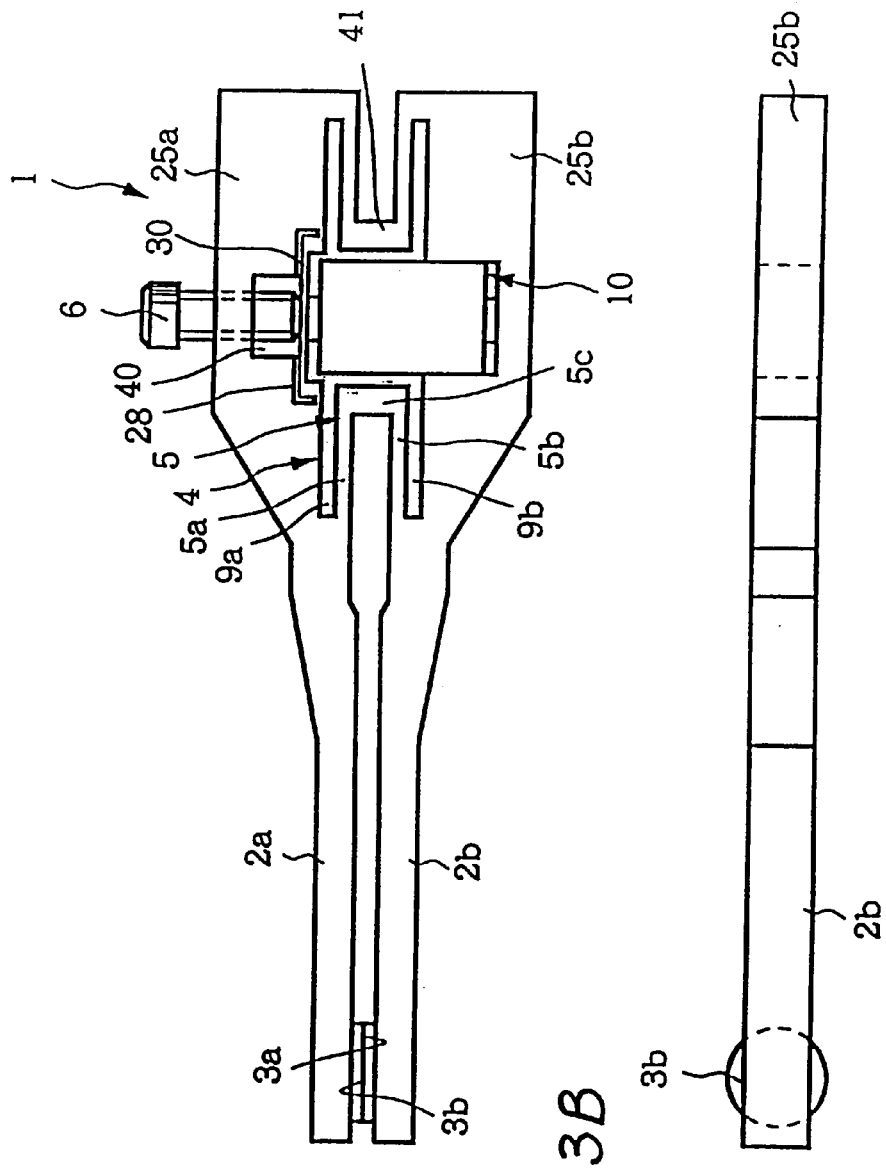

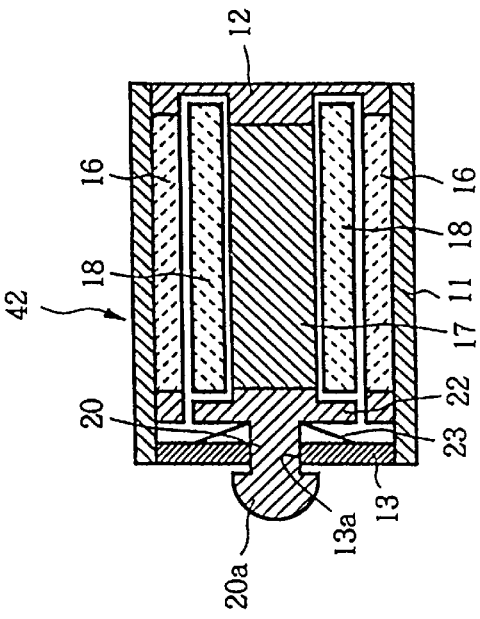
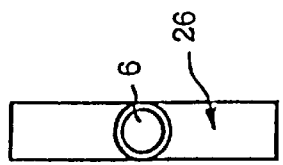
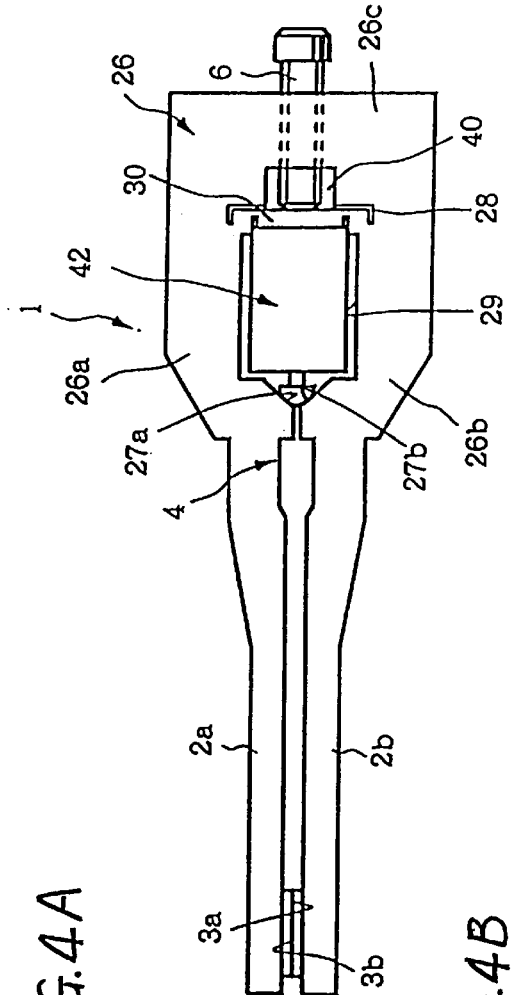
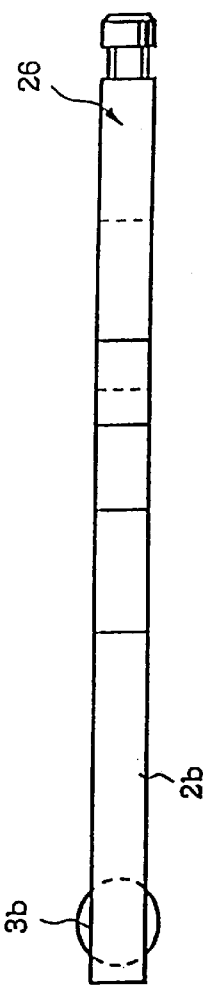

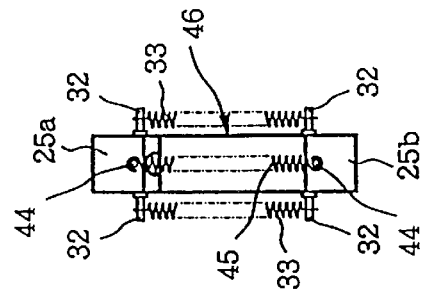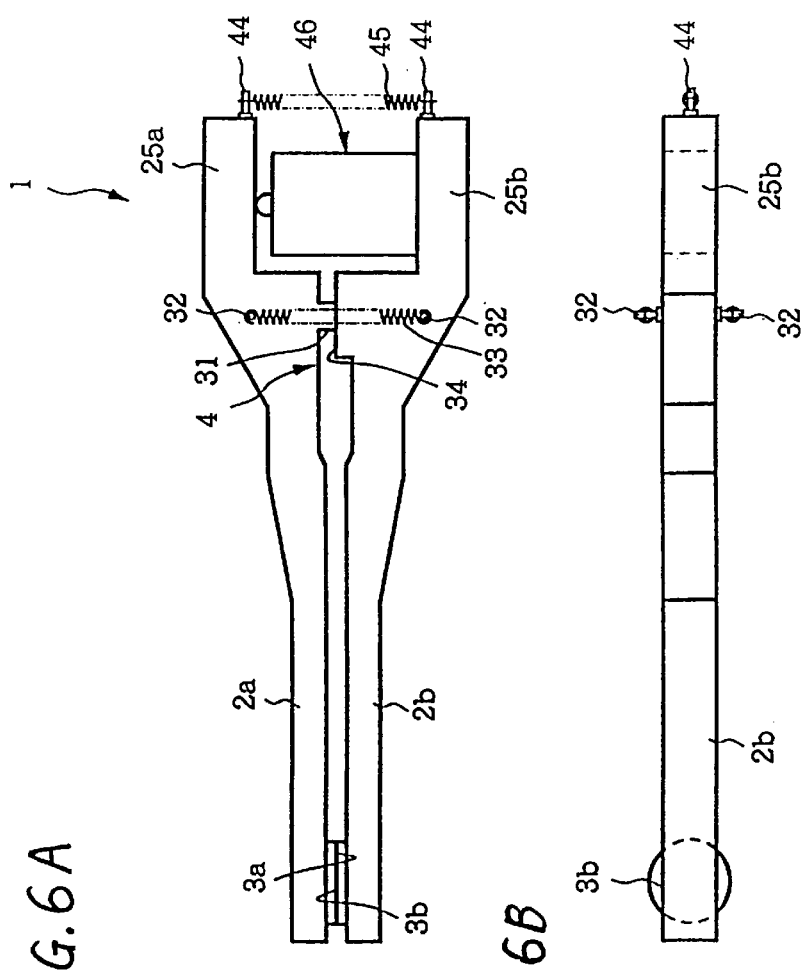

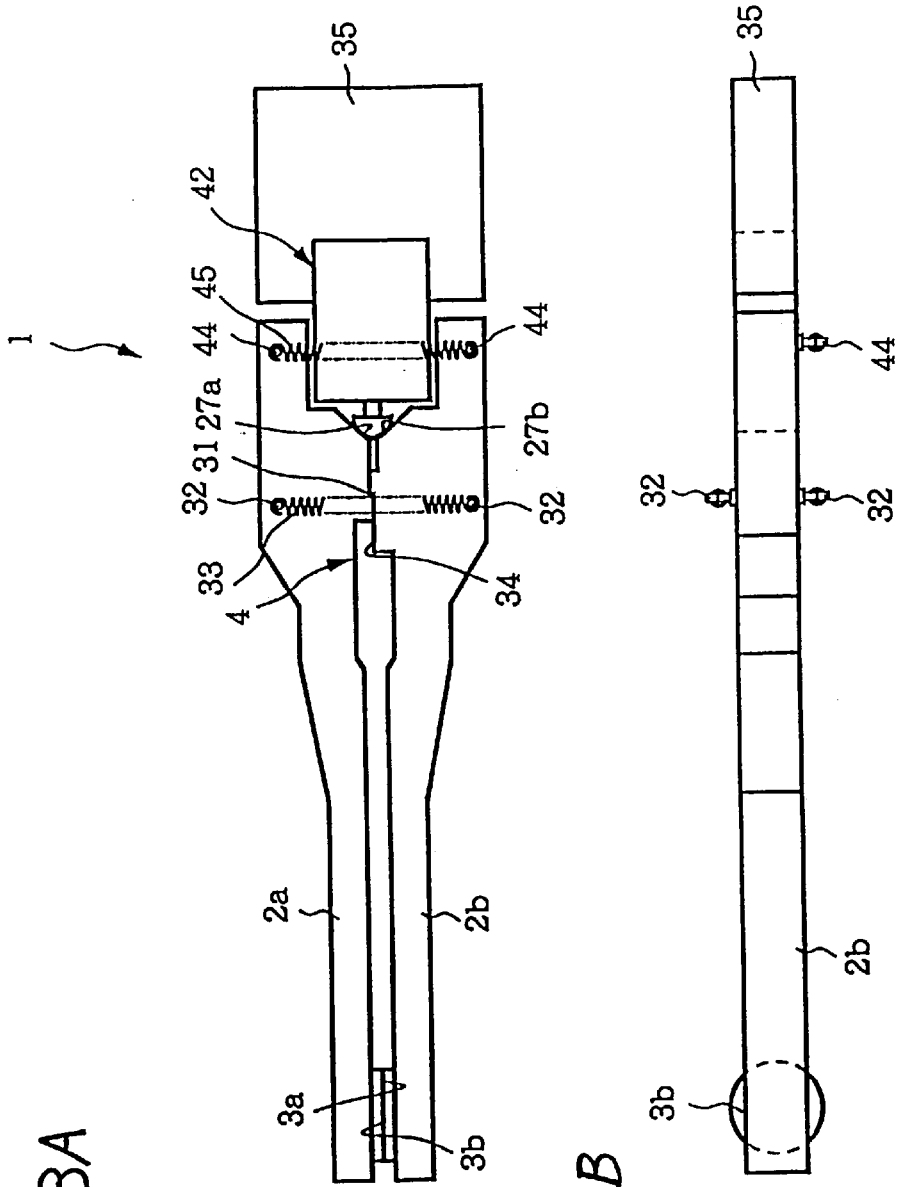

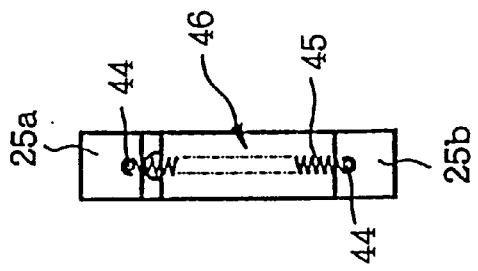
FIG. 9C
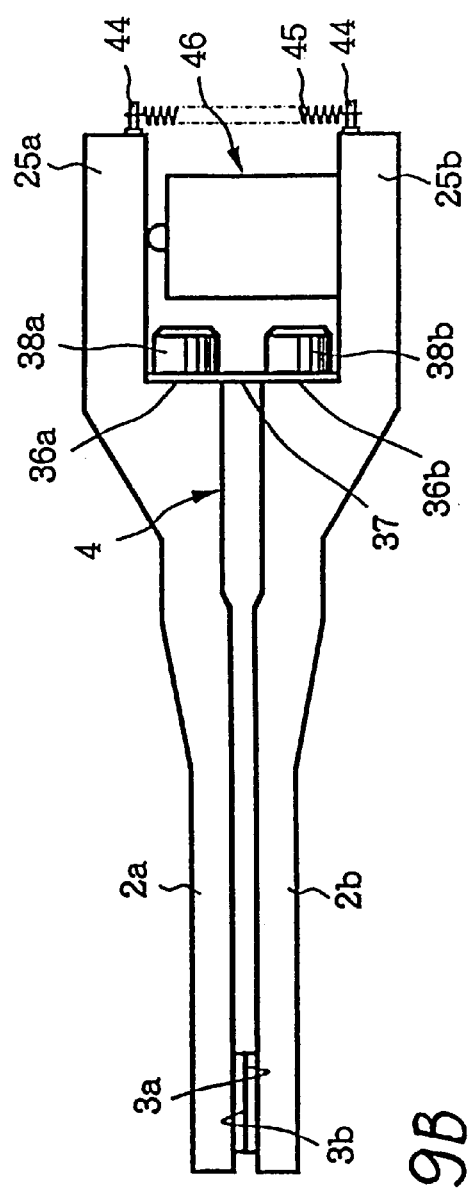
FIG. 9A
FIG. 9B
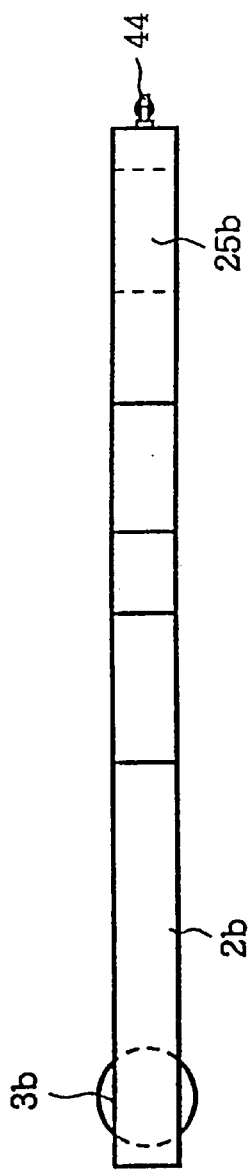

WIRE CLAMPER FOR BONDING APPARATUS

BACKGROUND OF THE INVENTION

1. Field of the Invention

The present invention relates to a wire clamper for a bonding apparatus for clamping a wire upon cutting the wire at a bonding point after completion of a wire bonding process during fabrication of a semiconductor device.

2. Description of the Prior Art

A wire bonding process is carried out as shown in FIG. 10 during fabrication of a semiconductor device. Specifically, a wire 51 in the form of a fine line of metal, such as gold or aluminum, is drawn out from a spool 50 and extended to a capillary tool 54 via a guide 52 and a wire clamper 53. The wire 51 is inserted into the capillary tool 54 and drawn out from a lower end of the capillary tool 54 by a given length. In this state, a ball is formed at a lower end of the drawn-out wire 51 using a torch or the like. Then, the capillary tool 54 is moved to a position just above an electrode 57 of a semiconductor component 56 fixed on an island 55 of a lead frame, and then lowered so that the ball is pressed onto the electrode 57 and bonded thereto. Subsequently, the capillary tool 54 is moved to a position just above a bonding point 59 of an external lead terminal 58 and then lowered so that the wire 51 drawn out from its lower end is pressed onto the bonding point 59 so as to be bonded thereto. Then, the capillary tool 54 is raised along with the wire clamper 53 which is fixed to the capillary tool 54. When the capillary tool 54 is moved upward by a distance corresponding to the foregoing given length, the wire clamper 53 clamps the wire 51 between a pair of clamping pieces 53a, 53b thereof. As a result, the wire 51 is cut just above the bonding point 59 so that the wire bonding for that portion is finished.

In the prior art, the wire clamper 53 may be of a type where the clamping pieces 53a, 53b are driven by a push-pull solenoid, of a type where they are driven by a voice coil linear motor or of a type where they are driven by a piezo-electric element.

However, the clamper of the push-pull solenoid type has disadvantages that the response speed is low and thus there is a limit to the speed-up of the bonding operation, that a fine adjustment of the clamping pressure is difficult and that the structure of the clamper becomes complicated. The clamper of the voice coil linear motor type has disadvantages that the structure of the clamper becomes complicated similar to the push-pull solenoid type and is increased in size. The clamper of the piezo-electric element type has disadvantages that, although the size reduction is achievable, the production cost is high since materials of the element are formed into a laminated structure, and that the high voltage is required for driving the clamper, resulting in high breakage rate and short life and further resulting in complicated power circuit.

SUMMARY OF THE INVENTION

Therefore, it is an object of the present invention to provide an improved wire clamper for a bonding apparatus.

According to one aspect of the present invention, a wire clamper for a bonding apparatus comprises a pair of clamper arms having tip portions, respectively, the tip portions clamping or releasing a wire therebetween when at least one of the clamper arms is operated; a magnetic field generating member for generating a magnetic field; and a giant-magnetostrictive alloy which is displaced according to the magnetic field generated by the magnetic field generating member so as to operate the at least one of the clamper arms. In this structure, when the magnetic field is generated by the magnetic field generating member, the giant-magnetostrictive alloy is displaced in the magnetic field based on either the positive magnetostriction where the alloy extends in parallel to a direction of the magnetic field, or the negative magnetostriction where the alloy retracts contrary to the positive magnetostriction. Through the displacement the giant-magnetostrictive alloy, the clamper arms can be operated.

It may be arranged that the clamper arms are unified at base end portions thereof, an input portion is provided at the base end portions for operating the clamper arms when pushed in a direction along the clamper arms, and a space portion is provided adjacent to the input portion, and that the giant-magnetostrictive alloy is arranged in the space portion so as to push the input portion in the direction when displaced to extend. In this structure, when the magnetic field is formed, the giant-magnetostrictive alloy is displaced to extend in the magnetic field based on the positive magnetostriction. Then, the input portion is pushed by the extended giant-magnetostrictive alloy in the direction along the clamper arms so that the clamper arms are operated. Further, since the clamper arms are unified at the base end portions thereof, the tip portions of the clamper arms are not liable to cause dislocation therebetween so that the wire can be properly clamped in the given position.

It may be arranged that the clamper arms are unified at base end portions thereof, and a pair of input members each extending in a direction along the corresponding clamper arm are provided at the base end portions, the input members operating the clamper arms when pushed in directions perpendicular to the clamper arms, and that the giant-magnetostrictive alloy is arranged so as to push the input members in the directions perpendicular to the clamper arms when displaced to extend. In this structure, since the clamper arms are operated via the input members, a force generated by the giant-magnetostrictive alloy can be increased by the lengths of the input members so as to achieve a sufficiently high clamping pressure.

It may be arranged that the clamper arms are unified at base end portions thereof, and a space portion is provided forward of a unified portion where the clamper arms are unified at the base end portions, the space portion having a pair of slant surfaces inclined in opposite directions at the same angle relative to a longitudinal center line of the wire clamper and operating the clamper arms when pushed, and that the giant-magnetostrictive alloy is arranged in the space portion so as to push the slant surfaces when displaced to extend. In this structure, since the clamper arms are operated by pushing the slant surfaces, the operation speed of the clamper arms can be set based on not only an adjustment of the current necessary for forming the magnetic field, but also the angles of the slant surfaces relative to the longitudinal center line of the wire clamper.

It may be arranged that a fulcrum projection is provided on one of the clamper arms and a fulcrum projection support surface is provided on the other of the clamper arms for supporting the fulcrum projection so that the clamper arms are operable using the fulcrum projection as a fulcrum, that a pair of input members each extending in a direction along the corresponding clamper arm are provided at base end portions of the clamper arms, respectively, the input members operating the clamper arms when pushed in directions perpendicular to the clamper arms, and that the giant-magnetostrictive alloy is arranged so as to push the input members in the directions perpendicular to the clamper arms when displaced to extend. In this structure, since the clamper arms are separate members, even if failure occurs in one of them, the wire clamper can still be used by replacing only that one having the failure.

It may be arranged that a fulcrum projection is provided on one of the clamper arms and a fulcrum projection support surface is provided on the other of the clamper arms for supporting the fulcrum projection so that the clamper arms are operable using the fulcrum projection as a fulcrum, that a pair of slant surfaces are provided at base end portions of the clamper arms, respectively, the slant surfaces inclined In opposite directions at the same angle relative to a longitudinal center line of the wire clamper and operating the clamper arms when pushed, and that the giant-magnetostrictive alloy is arranged separately from the clamper arms so as to push the slant surfaces when dispaced to extend. In this structure, since the clamper arms are separate members, even if failure occurs in one of them, the wire clamper can still be used by replacing only that one having the failure. Further, since the giant-magnetostrictive alloy is arranged separately from the clamper arms, when failure occurs in the giant-magnetostrictive alloy or the magnetic field generating member, it can be speedily dealt with by replacing it.

It may be arranged that the clamper arms are coupled to each other by a connecting member at base end portions thereof, and a pair of input members each extending in a direction along the corresponding clamper arm are provided at the base end portions, respectively, the input members operating the clamper arms when pushed in directions perpendicular to the clamper arms, and that the giant-magnetostrictive alloy is arranged so as to push the input members in the directions perpendicular to the clamper arms when displaced to extend. In this structure, since the clamper arms are separate members, even if failure occurs in one of them, the wire clamper can still be used by replacing only that one having the failure.

BRIEF DESCRIPTION OF THE DRAWINGS

The present invention will be understood more fully from the detailed description given hereinbelow, taken in conjunction with the accompanying drawings.

In the drawings:

FIGS. 1A, 1B and 1C show a wire clamper for a bonding apparatus according to a first preferred embodiment of the present invention, wherein FIG. 1A is a plane view, FIG. 1B is a front view and FIG. 1C is a right-side view;

FIGS. 3A, 3B and 3C show a wire clamper for a bonding apparatus according to a second preferred embodiment of the present invention, wherein FIG. 3A is a plane view, FIG. 3B is a front view and FIG. 3C is a right-side view;

FIGS. 4A, 4B and 4C show a wire clamper for a bonding apparatus according to a third preferred embodiment of the present invention, wherein FIG. 4A is a plane view, FIG. 4B is a front view and FIG. 4C is a right-side view;

FIG. 5 is a longitudinal sectional view of a giant-magnetostrictive actuator incorporated in the wire clamper shown in FIGS. 4A to 4C;

FIGS. 6A, 6B and 6C show a wire clamper for a bonding apparatus according to a fourth preferred embodiment of the present invention, wherein FIG. 6A is a plane view, FIG. 6B is a front view and FIG. 6C is a right-side view;

FIG. 7 is a longitudinal sectional view of a giant-magnetostrictive actuator incorporated in the wire clamper shown in FIGS. 6A to 6C;

FIGS. 8A, 8B and 8C show a wire clamper for a bonding apparatus according to a fifth preferred embodiment of the present invention, wherein FIG. 8A is a plane view, FIG. 8B is a front view and FIG. 8C is a right-side view;

FIGS. 9A, 9B and 9C show a wire clamper for a bonding apparatus according to a sixth preferred embodiment of the present invention, wherein FIG. 9A is a plane view, FIG. 9B is a front view and FIG. 9C is a right-side view.

DESCRIPTION OF THE PREFERRED EMBODIMENT

Now, the preferred embodiments of the present invention will be described hereinbelow with reference to the accompanying drawings. In FIGS. 1A to 9C, the same or like elements or structures are represented by the same reference signs.

Figure 1A:
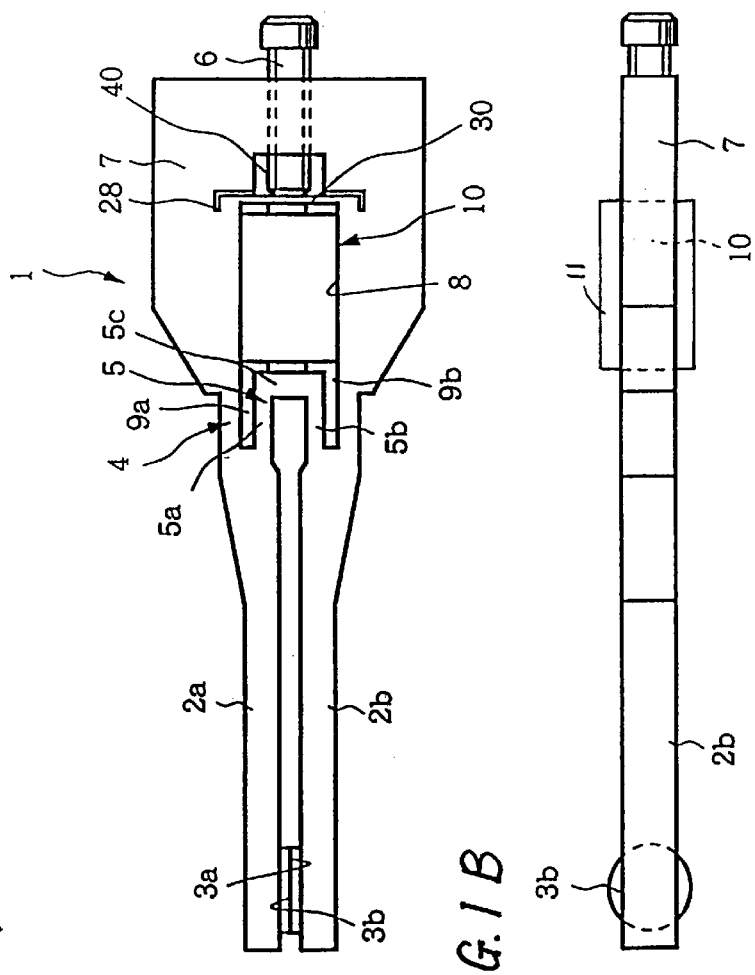
Figure 1B:
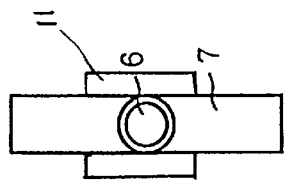
Figure 1C:
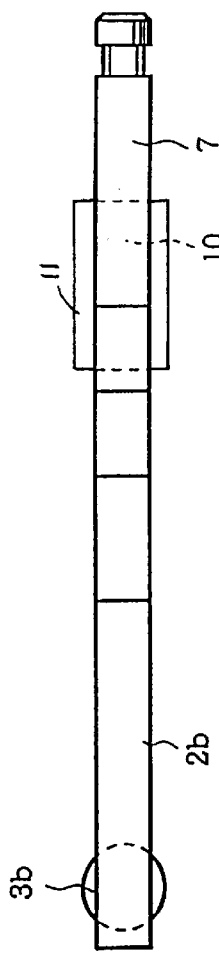

FIGS. 1A to 1C show a wire clamper 1 for a bonding apparatus according to the first preferred embodiment of the present invention. The clamper 1 comprises a pair of essentially parallel elongate clamper arms 2a, 2b facing each other. The clamper arms 2a, 2b are provided at their respective tip portions with ceramic clamping members 3a, 3b facing each other. The clamper arms 2a, 2b are unified with each other by a connecting frame 5 having an essentially 1-shape in section and formed at the inner sides of base end portions 4 of the clamper arms 2a, 2b. The connecting frame 5 comprises a pair of confronting portions 5a, 5b each being continuous at one end thereof with the base end portion 4 of the corresponding clamper arm 2a, 2b and each extending in a direction along the clamper arm 2a, 2b. The connecting frame 5 further comprises a bridge portion 5c, working as an input portion in this embodiment, which integrally bridges between the other ends of the confronting portions 5a, 5b.

A base portion 7 is integrally formed at the outer sides of the base end portions 4 of the clamper arms 2a, 2b. The base portion 7 is provided with a space portion 8, having a rectangular shape in section, adjacent to the bridge portion 5c of the connecting frame 5. Between the base portion 7 and the confronting portions 5a, 5b are provided slits 9a, 9b continuous with the space portion 8. The base portion 7 is further formed in the neighborhood of a rear end of the space portion 8 with a slit 28 extending in a direction perpendicular to the clamper arms 2a, 2b, and with a window 40 having a rectangular shape in section and continuous with the slit 28. As a result, a flexible portion 30, which is deformable, is formed between the window 40 and the space portion 8. Further, a clamping pressure adjustable screw 6 is screwed into the window 40 from a rear end of the base portion 7 so as to be in contact with the flexible portion 30 at its tip. In this embodiment, the clamper arms 2a, 2b, the connecting frame 5 and the base portion 7 are integrally formed of given metal, and the connecting frame 5 elastically holds the clamper arms 2a, 2b so that the tip portions thereof, that is, the clamping members 3a, 3b, are biased toward each other in clamper closing directions or clamping directions.

Figure 2:
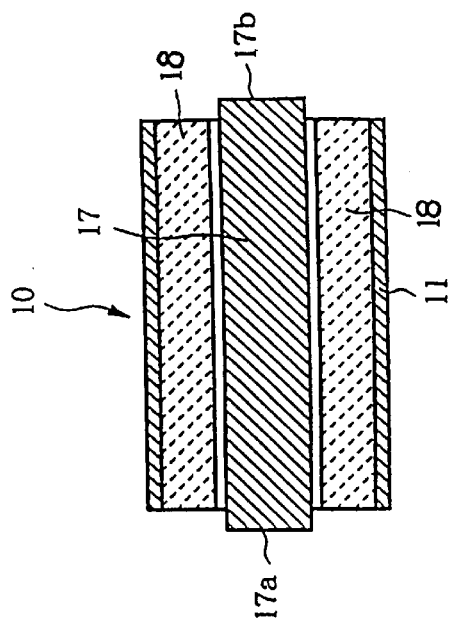
FIG. 2 is a longitudinal sectional view of a giant-magnetostrictive actuator incorporated in the wire clamper shown in FIGS. 1A to 1C.

A giant-magnetostrictive actuator 10 is disposed in the space portion 8. As shown in FIG. 2, the giant-magnetostrictive actuator 10 comprises a tubular housing 11 which includes therein a giant-magnetostrictive alloy 17 and a coil 18 wound around the giant-magnetostrictive alloy 17. The coil 18 is connected to a current supply source (not shown). The giant-magnetostrictive alloy 17 is arranged at the center of the housing 11 and projected outside the housing 11 at both ends 17a, 17b thereof.

The giant-magnetostrictive alloy 17 is in the form of a square bar of 0.5~3.0 mm square×5.0~20.0 mm length, preferably 0.8~1.2 mm square×8.0~12.0 mm length, cut out of a giant-magnetostrictive ingot through diamond cutting, electrical discharge machining, multi-wire saw machining or the like. In case of, for example, using a square bar of 1.0 mm square×10.0 mm length, the actuator 10 is capable of generating a force of 2.0 kgf at maximum. The composition of the giant-magnetostrictive alloy 17 is 1:2 in the atomic ratio of R (rare earth element) and Fe, that is, RFe2, for example, TbFe2, DyFe2, SmFe2, HoFe2 or ErFe2. More specifically, the composition of the giant-magnetostrictive alloy 17 is preferably Tb0.3Dy0.7Fe2 and more preferably Tb0.27Dy0.73Fe1.9, wherein the magnetostriction is around 1,000 ppm.

The giant-magnetostrictive actuator 10 is fixed in the space portion 8 by a proper fixing means, and both ends 17a, 17b of the giant-magnetostrictive alloy 17 are bonded to the longitudinal centers of the bridge portion 5c and the flexible portion 30, respectively.

Figure 10:
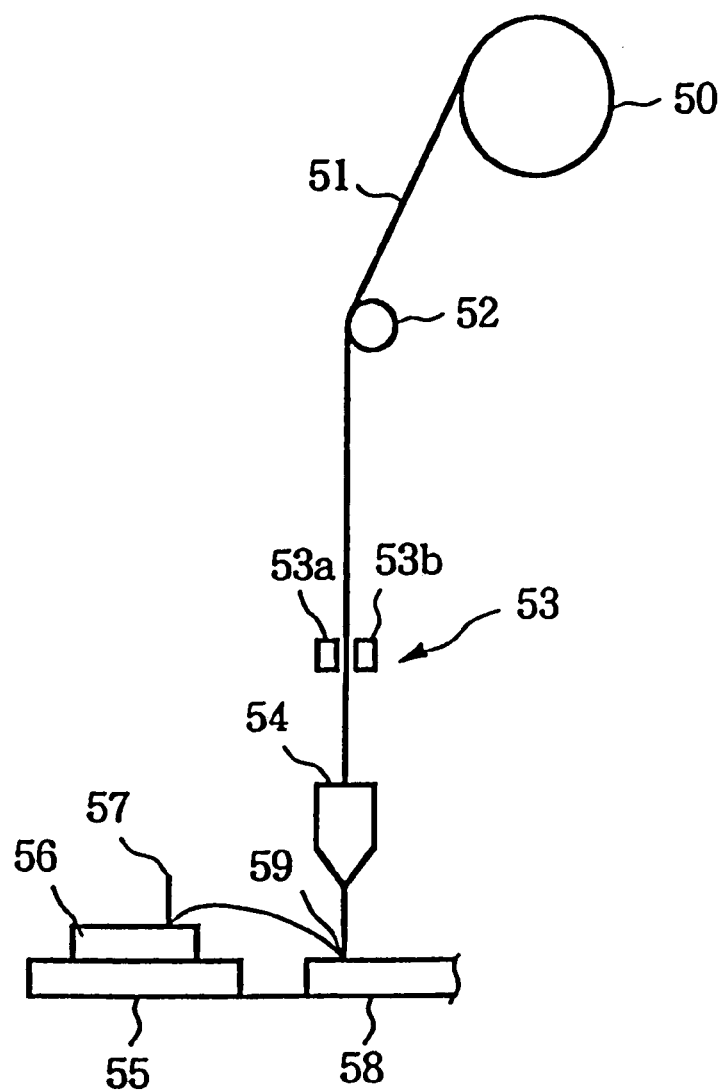
FIG. 10 is a diagram for explaining a wire bonding process.

In this embodiment, the wire clamper 1 is fixed at the base portion 7 to a support to which the capillary tool 54 (see FIG. 10) is attached, and used in a wire bonding process during fabrication of a semiconductor device. Specifically, when the current is supplied to the coil 18, the giant-magnetostrictive alloy 17 is displaced to extend in a magnetic field generated by the coil 18. Thus, the center of the bridge portion 5c is pressed by the end 17a of the giant-magnetostrictive alloy 17. A pressing force from the bridge portion 5c is exerted on the inner sides of the clamper arms 2a, 2b at the base end portions 4 via the confronting portions 5a, 5b. As a result, the clamper arms 2a, 2b are pushed outward so that the clamping members 3a, 3b at the tip portions thereof are forced in clamper opening directions or non-clamping directions so as to be spaced apart from each other. Accordingly, in this state, the wire 51 (see FIG. 10) is not clamped by the clamping members 3a, 3b and thus is free to move therebetween.

On the other hand, when the supply of the current is stopped upon cutting the wire 51 just above the bonding point 59 (see FIG. 10), the giant-magnetostrictive alloy 17 is retracted due to the loss of the magnetic field. Accordingly, the pressing against the bridge portion 5c is stopped, and thus the force exerted on the inner sides of the clamper arms 2a, 2b at the base end portions 4 is lost. Therefore, due to a restoring force of the connecting frame 5, the tip portions of the clamper arms 2a, 2b, that is, the clamping members 3a, 3b, are forced in the clamper closing directions.

Further, since the ends 17a, 17b of the giant-magnetostrictive alloy 17 are bonded to the bridge portion 5c and the flexible portion 30, respectively, a tensile force is applied to the bridge portion 5c following the retraction of the giant-magnetostrictive alloy 17. Accordingly, the tip portions of the clamper arms 2a, 2b are moved in the clamper closing directions due to the foregoing restoring force and the tensile force so as to firmly clamp the wire 51 between the clamping members 3a, 3b. Thus, by clamping the wire 51 between the clamping members 3a, 3b while raising the capillary tool 54, the wire 51 is cut just above the bonding point 59 so that the wire bonding for that portion is finished.

In this embodiment, since the pair of clamper arms 2a, 2b are unified with each other at their base end portions 4, a positional error between the tip portions of the clamper arms 2a, 2b is not liable to occur so that the clamping members 3a, 3b are matched with high accuracy to reliably clamp the wire 51 therebetween. Further, by screwing forward or backward the clamping pressure adjustable screw 6, the clamping pressure applied to the wire 51 when clamped between the clamping members 3a, 3b can be adjusted.

In this embodiment, the ends 17a, 17b of the giant-magnetostrictive alloy 17 are bonded to the bridge portion 5c and the flexible portion 30, respectively. On the other hand, it may be arranged not to bond the ends 17a, 17b to the portions 5c, 30, but merely put them in contact with the portions 5c, 30, respectively. In this case, since the clamping pressure relies on the restoring force of the connecting frame 5 with no tensile force generated, angles, widths or others of the confronting portions 5a, 5b can be set so as to achieve a given clamping pressure.

FIGS. 3A to 3C show a wire clamper 1 for a bonding apparatus according to the second preferred embodiment of the present invention. As in the first preferred embodiment, clamper arms 2a, 2b are unified with each other at base end portions 4 thereof by means of a connecting frame 5. Further, in this embodiment, at the base end portions 4 of the clamper arms 2a, 2b, a pair of input members 25a, 25b are integrally provided at the outer sides of slits 9a, 9b. Each of the input members 25a, 25b extends in a direction along the clamper arm 2a, 2b. The input members 25a, 25b are unified with each other at their rear ends by means of an essentially 1-shaped deformable portion 41. Between the input members 25a, 25b, the giant-magnetostrictive actuator 10 shown in FIG. 2 is interposed as being offset toward the input member 25b. The giant-magnetostrictive alloy 17 of the actuator 10 abuts the inner surfaces of the input members 25b, 25a at the opposite ends 17a, 17b thereof, respectively.

In this embodiment, the connecting frame 5 elastically holds the clamper arms 2a, 2b so that a given gap is provided between clamping members 3a, 3b to allow the wire to freely move therebetween when the actuator 10 is not energized. At the input member 25a, a clamping pressure adjustable screw 6, a slit 28, a window 40 and a flexible portion 30 are provided.

Accordingly, in this embodiment, the supply of the current to the coil 18 of the actuator 10 is stopped during non-clamping. In this state, the giant-magnetostrictive alloy 17 is retracted so that the input members 25a, 25b are not moved outward to maintain the initial state. Thus, the clamper arms 2a, 2b hold the clamping members 3a, 3b to provide the given gap therebetween so as to allow the wire to be free as described above.

On the other hand, when the current is supplied to the coil 18 upon cutting the wire, the giant-magnetostrictive alloy 17 is deformed to extend in the magnetic field generated by the coil 18. This causes the input members 25a, 25b to move outward so as to deform end portions of confronting portions 5a, 5b joining the clamper arms 2a, 2b to approach each other. Following this, the tip portions of the clamper arms 2a, 2b are forced in the clamper closing directions so that the wire can be clamped between the clamping members 3a, 3b.

As appreciated, since the clamper arms 2a, 2b are actuated via the input members 25a, 25b, the sufficient clamping pressure can be produced by increasing the lengths of the input members 25a, 25b even if a force generated by the giant-magnetostrictive alloy 17 is small.

To the contrary, the clamping pressure can also be adjusted to be a proper small value. Specifically, for achieving a displacement of, for example, 100 µm between the clamper arms 2a, 2b and reducing a clamping pressure to a proper value of, for example, about 50 g, it is preferable to use the leverage mechanism shown in this embodiment. As appreciated, according to the leverage principle, when the leverage is, for example, 1:25, the displacement of the clamper arms 2a, 2b is magnified by 25 times while the clamping pressure becomes 1/25.

On the other hand, since the giant-magnetostrictive alloy is large in displacement and output, the magnification can be set to a small value.

FIGS. 4A to 4C show a wire clamper 1 for a bonding apparatus according to the third preferred embodiment of the present invention. In this embodiment, clamper arms 2a, 2b are unified by a base portion 26 integrally formed at base end portions 4 of the clamper arms 2a, 2b. The base portion 26 comprises movable portions 26a, 26b each being continuous with the corresponding clamper arm 2a, 2b and each extending in a direction along the clamper arm 2a, 2b, and a base member 26c being wider than the movable portions 26a, 26b and bridging between rear ends of the movable portions 26a, 26b. A space portion 29 is formed between the movable portions 26a, 26b. At a front end of the space portion 29 adjacent to the clamper arms 2a, 2b, slant surfaces 27a, 27b are formed corresponding to the clamper arms 2a, 2b, respectively. The slant surfaces 27a, 27b are inclined in opposite directions at the same angle relative to a longitudinal center line of the wire clamper 1. The base member 26c is formed in the neighborhood of a rear end of the space portion 29 with a slit 28 extending in a direction perpendicular to the clamper arms 2a, 2b, and with a window 40 continuous with the slit 28. As a result, a flexible portion 30, which is deformable, is formed between the window 40 and the space portion 29. Further, a clamping pressure adjustable screw 6 is screwed into the window 40 from a rear end of the base member 26c so as to be in contact with the flexible portion 30 at its tip.

A giant-magnetostrictive actuator 42 is disposed in the space portion 29. As shown in FIG. 5, the giant-magnetostrictive actuator 42 comprises a tubular housing 11 whose both ends are closed by a rear plate 12 and a front plate 13. At the center of the front plate 13, a through hole 13a is formed. An annular permanent magnet 16 is disposed along the inner periphery of the housing 11, and a giant-magnetostrictive alloy 17 is disposed at the center of the permanent magnet 16. The permanent magnet 16 is provided for generating a bias magnetic field and may be omitted. Further, between the giant-magnetostrictive alloy 17 and the permanent magnet 16 is arranged a coil 18 for generating a magnetic field. Ends of the coil 18 are connected to current supply terminals (not shown) provided at the housing 11.

An actuator rod 20 is coupled to a front end of the giant-magnetostrictive alloy 17. A tip portion 20a of the actuator rod 20 is in the form of a spherical surface and projected outward via the through hole 13a. The actuator rod 20 is formed with a flange 22 at its base end portion. A coned disc spring 23 is interposed between the flange 22 and the front plate 13. The coned disc spring 23 abuts the flange 22 under pressure so as to bias the giant-magnetostrictive alloy 17 toward the rear plate 12 via the actuator rod 20.

The giant-magnetostrictive actuator 42 is fixed in the space portion 29 such that the rear plate 12 is in abutment with the flexible portion 30 and the tip portion 20a of the actuator rod 20 uniformly abuts the slant surfaces 27a, 27b. As in the foregoing first preferred embodiment, the clamper arms 2a, 2b are elastically held by the base portion 26 so as to be biased in the clamper closing directions.

When the current is supplied to the coil 18 from the current supply terminals, the giant-magnetostrictive alloy 17 is displaced to extend. Thus, the actuator rod 20 is pressed by the giant-magnetostrictive alloy 17 and further projected outward via the through hole 13a of the front plate 13 against the biasing force of the coned disc spring 23. This causes the tip portion 20a of the actuator rod 20 to push the slant surfaces 27a, 27b. Accordingly, the clamper arms 2a, 2b are forced outward so that the clamping members 3a, 3b at the tip portions thereof are moved in the clamper opening directions. Therefore, in this state, the wire 51 is not clamped by the clamping members 3a, 3b and thus is free to move therebetween.

On the other hand, when the supply of the current is stopped upon cutting the wire 51 just above the bonding point 59, the giant-magnetostrictive alloy 17 is retracted due to the loss of the magnetic field. Accordingly, the actuator rod 20 biased by the coned disc spring 23 at the flange 22 is also moved together with the alloy 17 so as to return to the initial position as shown in FIG. 5. This releases the pressing against the slant surfaces 27a, 27b so that the clamper arms 2a, 2b, due to their restoring forces, move the clamping members 3a, 3b at the tip portions thereof in the clamper closing directions. Thus, the wire can be clamped under the clamping pressure corresponding to the restoring forces of the clamper arms 2a, 2b. In this embodiment, since the clamper arms 2a, 2b are operated following the pressing onto the pair of slant surfaces 27a, 27b, the operation speed of the clamper arms 2a, 2b can be set based on not only the adjustment of the current supplied to the coil 18 but also the angles of the slant surfaces 27a, 27b relative to the longitudinal center line of the wire clamper 1.

FIGS. 6A to 6C show a wire clamper 1 for a bonding apparatus according to the fourth preferred embodiment of the present invention. In this embodiment, clamper arms 2a, 2b are formed separately from each other. At a base end portion 4 of the clamper arm 2a, an input member 25a is integrally formed and extends in a direction along the clamper arm 2a, and a fulcrum projection 31 having a flat tip surface is projected in a direction perpendicular to the clamper arm 2a. A pair of pins 32, 32 are provided upright at corresponding positions on the surface and the underside of the base end portion 4. One-side ends of a pair of coil springs 33, 33 are engaged with the pins 32, 32.

Also at a base end portion 4 of the clamper arm 2b, an input member 25b is integrally formed and extends in a direction along the clamper arm 2b, and a fulcrum projection support flat surface 34 is formed for engagement with the fulcrum projection 31. A pair of pins 32, 32 are provided upright at corresponding positions on the surface and the underside of the base end portion 4. The other-side ends of the pair of coil springs 33, 33 are engaged with the pins 32, 32 provided on the base end portion 4 of the clamper arm 2b. Further, a pair of pins 44, 44 are provided upright on rear end surfaces of the input members 25a, 25b, respectively. Between the pins 44, 44 is detachably disposed a clamping pressure adjustable spring 45 applying a biasing force in a tensile direction. In practice, a plurality of clamping pressure adjustable springs 45 having different spring forces are prepared in advance and one of them is selected for use so that the clamping pressure can be adjusted.

A giant-magnetostrictive actuator 46 is interposed between the input members 25a, 25b. As shown in FIG. 7, the giant-magnetostrictive actuator 46 comprises a tubular housing 11 whose both ends are closed by a rear plate 12 and a front plate 13. At the center of the front plate 13, a through hole 13a is formed. An annular permanent magnet 16 is disposed along the inner periphery of the housing 11, and a giant-magnetostrictive alloy 17 is disposed at the center of the permanent magnet 16. The permanent magnet 16 is provided for generating a bias magnetic field and may be omitted. Further, between the giant-magnetostrictive alloy 17 and the permanent magnet 16 is arranged a coil 18 for generating a magnetic field. Ends of the coil 18 are connected to current supply terminals (not shown) provided at the housing 11. A tip portion 17a of the giant-magnetostrictive alloy 17 is in the form of a spherical surface and projected outward passing through a ring slide spacer 21 fitted in the through hole 13a. The giant-magnetostrictive actuator 46 abuts an inner surface of the input member 25b at the rear plate 12 and further abuts an inner surface of the input member 25a at the tip portion 17a of the giant-magnetostrictive alloy 17.

When the current supply to the coil 18 is stopped, the giant-magnetostrictive alloy 17 is retracted so that the input members 25a, 25b are not moved outward to maintain the initial state. Specifically, the input members 25a, 25b are elastically held by the biasing force of the clamping pressure adjustable spring 45 such that the tip surface of the fulcrum projection 31 is in full contact with the fulcrum projection support surface 34. In this state, the clamper arms 2a, 2b hold the clamping members 3a, 3b to provide a given gap therebetween so as to allow the wire to be free to move.

On the other hand, when the current is supplied to the coil 18 upon cutting the wire, the giant-magnetostrictive alloy 17 is displaced to extend in a magnetic field formed by the coil 18. As a result, the tip portion 17a of the giant-magnetostrictive alloy 17 pushes outward the input member 25a and, due to its reaction, the other input member 25b is also pushed outward. Accordingly, the input members 25a, 25b are moved outward and, following this, the tip portions of the clamper arms 2a, 2b are forced in the clamper closing directions so that the wire can be clamped between the clamping members 3a, 3b.

FIGS. 8A to 8C show a wire clamper 1 for a bonding apparatus according to the fifth preferred embodiment of the present invention. As in the fourth preferred embodiment, clamper arms 2a, 2b are formed separately from each other, and a fulcrum projection 31, two pairs of pins 32—32 and a pair of coil springs 33, 33 are provided. Further, as in the foregoing third preferred embodiment, a pair of slant surfaces 27a, 27b are formed at base end portions 4 of the clamper arms 2a, 2b, respectively. Moreover, similar to the fourth preferred embodiment, a pair of pins 44, 44 and a clamping pressure adjustable spring 45 are provided on the surfaces of the base end portions 4.

In this embodiment, the giant-magnetostrictive actuator 42 as shown in FIG. 5 is supported to a base member 35, which is separate from the clamper arms 2a, 2b, via the rear plate 12, and the tip portion 20a of the actuator rod 20 is in the form of a spherical surface and uniformly abuts the slant surfaces 27a, 27b.

When the current supply to the coil 18 is stopped, the actuator rod 20 is retreated due to a biasing force of the coned disc spring 23. Accordingly, the clamper arms 2a, 2b are elastically held by a biasing force of the clamping pressure adjustable spring 45 such that a tip surface of the fulcrum projection 31 is in full contact with a fulcrum projection support surface 34. In this state, the clamper arms 2a, 2b hold clamping members 3a, 3b to provide a given gap therebetween so as to allow the wire to be free to move.

On the other hand, when the current is supplied to the coil 18 upon cutting the wire, the giant-magnetostrictive alloy 17 is displaced to extend in the magnetic field formed by the coil 18. Thus, the actuator rod 20 is pushed by the giant-magnetostrictive alloy 17 and further projected outward via the through hole 13a of the front plate 13 against the biasing force of the coned disc spring 23. This causes the tip portion 20a of the actuator rod 20 to push the slant surfaces 27a, 27b. At this time, since a contact point between the fulcrum projection 31 and the fulcrum projection support surface 34, working as a rotation fulcrum of the clamper arms 2a, 2b, is provided forward of the slant surfaces 27a, 27b, as the tip portion 20a of the actuator rod 20 pushes the slant surfaces 27a, 27b, the clamper arms 2a, 2b cause the tip portions thereof to move in the clamper closing directions while extending the clamping pressure adjustable spring 45. As a result, the wire is clamped between the clamping members 3a, 3b.

FIGS. 9A to 9C show a wire clamper 1 for a bonding apparatus according to the sixth preferred embodiment of the present invention. As in the fourth and fifth preferred embodiments, clamper arms 2a, 2b are formed separately from each other. Flat portions 36a, 36b extending in a direction perpendicular to the clamper arms 2a, 2b are formed at the inner sides of base end portions 4 of the clamper arms 2a, 2b. On the other hand, input members 25a, 25b each extending in a direction along the corresponding clamper arm 2a, 2b are formed at the outer sides of the base end portions 4. A flexible connecting member 37 bridges between the flat portions 36a, 36b of the clamper arms 2a, 2b. The flexible connecting member 37 is fixed to the flat portions 36a, 36b by means of screws 38a, 38b. Accordingly, the clamper arms 2a, 2b are coupled to each other via the connecting member 37. The giant-magnetostrictive actuator 46 as shown in FIG. 7 is interposed between the input members 25a, 25b. As in the foregoing fourth preferred embodiment, the giant-magnetostrictive actuator 46 abuts an inner surface of the input member 25b at the rear plate 12 and further abuts an inner surface of the input member 25a at the tip portion 17a of the giant-magnetostrictive alloy 17.

When the current supply to the coil 18 is stopped, the giant-magnetostrictive alloy 17 is retracted so that the input members 25a, 25b are not moved outward to maintain the initial state. In this state, the clamper arms 2a, 2b hold clamping members 3a, 3b to provide a given gap therebetween so as to allow the wire to be free to move.

On the other hand, when the current is supplied to the coil 18 upon cutting the wire, the giant-magnetostrictive alloy 17 is displaced to extend in the magnetic field formed by the coil 18. As a result, the tip portion 17a of the giant-magnetostrictive alloy 17 pushes outward the input member 25a and, due to its reaction, the other input member 25b is also pushed outward. Accordingly, the input members 25a, 25b are moved outward and, following this, the tip portions of the clamper arms 2a, 2b are forced in the clamper closing directions so that the wire can be clamped between the clamping members 3a, 3b.

When the current supply to the coil 18 is stopped in this state, the giant-magnetostrictive alloy 17 is retracted. Accordingly, due to a restoring force of the connecting member 37 and a tensile force of the clamping pressure adjustable spring 45, the clamper arms 2a, 2b return to the initial state where the given gap is provided between the clamping members 3a, 3b.

In the fourth to sixth preferred embodiments, the clamper arms 2a, 2b are formed separately from each other. Accordingly, even if failure occurs in one of them, the wire clamper can still be used by replacing only that one having the failure. Thus, the continuous use of the wire clamper is possible with low cost. Further, in the sixth preferred embodiment, since the clamper arms 2a, 2b have the same shape, the wire clamper can be produced with only one kind of the clamper arms, and further the replacement of the clamper arms is possible with only one kind thereof. Accordingly, the production cost as well as the maintenance cost can be reduced.

According to the foregoing preferred embodiments of the present invention, the following effects are achieved:

Since the clamper arms of the wire clamper are actuated by means of the displacement of the giant-magnetostrictive alloy following the formation of the magnetic field, the reduction in size and weight of the clamper can be achieved, the structure of the clamper can be simplified, and the production of the clamper can be facilitated. Further, the response speed is improved (for example, increased by ten times as compared with using the piezo-electric element) so that the working efficiency is enhanced. Further, the clamper can be operated with low voltages to ensure the safety of working environment. Further, since the power supply and the giant-magnetostrictive metal are out of contact, the clamper is excellent in durability. Further, since it is sufficient for the drive circuit to generate the magnetic field, the drive circuit having the high durability can be easily produced. Further, since the Curie temperature of the giant-magnetostrictive metal is high, it can withstand the high-temperature atmosphere about 100° C. so that the wire clamping pressure can be widely changed by controlling the current supply.

In some of the preferred embodiments, the pair of clamper arms are unified at the base end portions thereof. Accordingly, the tip portions of the clamper arms are not liable to cause dislocation therebetween so that the wire can be properly clamped in the given position.

In some of the preferred embodiments, the pair of input members are provided each extending in the direction along the corresponding clamper arm and each actuating the corresponding clamper arm when pushed in the direction perpendicular to the clamper arm, and the giant-magnetostrictive alloy is arranged so as to push the Input members in the foregoing directions when displaced to extend. Accordingly, since the clamper arms are operated via the input members, even if the force generated by the giant-magnetostrictive alloy is small, the sufficient clamping pressure can be achieved by increasing the lengths of the input members.

In some of the preferred embodiments, the clamper arms are actuated by pushing the pair of slant surfaces. Accordingly, the operation speed of the clamper arms can be set based on not only the adjustment of the current supplied to the coil but also the angles of the slant surfaces relative to the longitudinal center line of the wire clamper.

In some of the preferred embodiments, the clamper arms are formed separately from each other. Accordingly, even if failure occurs in one of them, the wire clamper can still be used by replacing only that one having the failure. Thus, the continuous use of the wire clamper is possible with low cost.

Further, since the giant-magnetostrictive actuator is separate from the clamper arms, the replacement thereof is easy. Accordingly, it can be speedily dealt with when failure occurs in the giant-magnetostrictive alloy or the magnetic field generating coil.

While the present invention has been described in terms of the preferred embodiments, the invention is not to be limited thereto, but can be embodied in various ways without departing from the principle of the invention as defined in the appended claims.

What is claimed is:

1. A wire clamper for a bonding apparatus comprising:

a pair of clamper arms having tip portions, respectively, said tip portions clamping or releasing a wire therebetween when at least one of said clamper arms is operated;

a magnetic field generating member for generating a magnetic field; and a giant-magnetostrictive alloy which is displaced according to said magnetic field generated by said magnetic field generating member so as to operate said at least one of the clamper arms.

2. The wire clamper according to claim 1, wherein said clamper arms are unified at base end portions thereof, an input portion is provided at said base end portions for operating said clamper arms when pushed in a direction along said clamper arms, and a space portion is provided adjacent to said input portion, and wherein said giant-magnetostrictive alloy is arranged in said space portion so as to push said input portion in said direction when displaced to extend.

3. The wire clamper according to claim 1, wherein said clamper arms are unified at base end portions thereof, and a pair of input members each extending in a direction along the corresponding clamper arm are provided at said base end portions, said input members operating said clamper arms when pushed in directions perpendicular to said clamper arms, and wherein said giant-magnetostrictive alloy is arranged so as to push said input members in the directions perpendicular to said clamper arms when displaced to extend.

4. The wire clamper according to claim 1, wherein said clamper arms are unified at base end portions thereof, and a space portion is provided forward of a unified portion where said clamper arms are unified at said base end portions, said space portion having a pair of slant surfaces inclined in opposite directions at the same angle relative to a longitudinal center line of the wire clamper and operating said clamper arms when pushed, and wherein said giant-magnetostrictive alloy is arranged in said space portion so as to push said slant surfaces when displaced to extend.

5. The wire clamper according to claim 1, wherein a fulcrum projection is provided on one of said clamper arms and a fulcrum projection support surface is provided on the other of said clamper arms for supporting said fulcrum projection so that said clamper arms are operable using said fulcrum projection as a fulcrum, wherein a pair of input members each extending in a direction along the corresponding clamper arm are provided at base end portions of said clamper arms, respectively, said input members operating said clamper arms when pushed in directions perpendicular to said clamper arms, and wherein said giant-magnetostrictive alloy is arranged so as to push said input members in the directions perpendicular to said clamper arms when displaced to extend.

6. The wire clamper according to claim 1, wherein a fulcrum projection is provided on one of said clamper arms and a fulcrum projection support surface is provided on the other of said clamper arms for supporting said fulcrum projection so that said clamper arms are operable using said fulcrum projection as a fulcrum, wherein a pair of slant surfaces are provided at base end portions of said clamper arms, respectively, said slant surfaces inclined in opposite directions at the same angle relative to a longitudinal center line of the wire clamper and operating said clamper arms when pushed, and wherein said giant-magnetostrictive alloy is arranged separately from said clamper arms so as to push said slant surfaces when displaced to extend.

7. The wire clamper according to claim 1, wherein said clamper arms are coupled to each other by a connecting member at base end portions thereof, and a pair of input members each extending in a direction along the corresponding clamper arm are provided at said base end portions, respectively, said input members operating said clamper arms when pushed in directions perpendicular to said clamper arms, and wherein said giant-magnetostrictive alloy is arranged so as to push said input members in the directions perpendicular to said clamper arms when displaced to extend.

* * * * *